(12) United States Patent
Solomon et al.

(10) Patent No.: US 6,190,629 B1
(45) Date of Patent: Feb. 20, 2001

(54) ORGANIC ACID SCRUBBER AND METHODS

(75) Inventors: Glenn S. Solomon, Redwood City; David J. Miller, Belmont; Tetsuzo Ueda, Menlo Park, all of CA (US)

(73) Assignee: CBL Technologies, Inc., Redwood City, CA (US)

( * ) Notice: Under 35 U.S.C. 154(b), the term of this patent shall be extended for 0 days.

(21) Appl. No.: 09/293,443

(22) Filed: Apr. 16, 1999

(51) Int. Cl.$^7$ ............... C01C 1/12; C01B 7/00; C01B 21/00; B01D 53/54; B01D 53/58

(52) U.S. Cl. ............... 423/238; 95/9; 95/223; 95/230; 422/168; 422/169; 423/235; 423/237; 423/240 R

(58) Field of Search ............... 423/235, 237, 423/238, 240 R; 95/232, 233, 9, 223, 230; 422/30, 168, 169

(56) References Cited

U.S. PATENT DOCUMENTS

| | | | |
|---|---|---|---|
| 4,183,902 | * | 1/1980 | Hashimoto ............... 423/210 |
| 4,902,489 | * | 2/1990 | Watanabe ............... 423/245.1 |
| 5,720,926 | * | 2/1998 | Whipp ............... 422/110 |

OTHER PUBLICATIONS

Hawley's "Condensed Chemical Dictionary" 13th edition. pp. 7, 274, 827–828, 861, 1074.*

* cited by examiner

*Primary Examiner*—Tom Dunn
*Assistant Examiner*—Maribel Medina
(74) *Attorney, Agent, or Firm*—Lumen Intellectual Property Services

(57) ABSTRACT

A scrubber assembly for removal of water soluble and/or alkaline gases from an exhaust stream uses a scrubber mixture contained within at least one scrubber vessel. Preferably the scrubber mixture include a liquid phase including an aqueous acid solution, and solid phase including a solid organic acid. Preferably, the scrubber mixture includes a solid carboxylic acid having low toxicity and low corrosiveness to system components. In one embodiment, a plurality of scrubber vessels, each containing the scrubber mixture are connected in series. The scrubber assembly may further include an indicator tank containing an indicator mixture. The pH of the scrubber mixture and/or indicator mixture may be monitored, thereby making operation of the system not only simpler and more reliable, but also more efficient. A method for removal of water soluble and/or alkaline gases from an exhaust stream is also disclosed.

50 Claims, 8 Drawing Sheets

ORGANIC ACID SCRUBBER AND METHODS

BACKGROUND OF THE INVENTION

1. Field of the Invention

The present invention relates to low maintenance scrubbers for the removal of water soluble and/or alkaline gases. The invention further relates to high efficiency acid scrubbers for the removal of hazardous components from an exhaust gas stream. The invention also relates to the removal of alkaline gases by reaction with an organic acid. The invention still further relates to methods of removing hazardous gases by their reaction with non-hazardous materials.

2. Background of the Related Art

In numerous chemical processes, waste gases pass into an exhaust stream. Many waste gas components, including by-products and excess reactants, are toxic and/or hazardous, and must be removed before the remaining exhaust is released into the environment. Two examples of hazardous gases which enter an exhaust stream are ammonia ($NH_3$) and hydrochloric acid (HCl). These gases are both used for the hydride vapor-phase epitaxy (HVPE) growth of gallium nitride (GaN) and related semiconductors. Typically the ratio of ammonia ($NH_3$) and hydrochloric acid (HCl) is very larger; on the order of $NH_3/HCl=500$. Further, only a fraction of the total quantity of each of these gases used during HVPE actually participate in a reaction, with the bulk passing into the exhaust stream. Because these waste gases are toxic and corrosive, they cannot be released into the atmosphere, and therefore must be separated from the non-toxic components of the exhaust stream and because ammonia ($NH_3$) is the largest component of the waste gas efficient removal of ammonia ($NH_3$) is one of the most crucial features of a scrubber system.

Fortunately, both ammonia and HCl are highly soluble in water. Thus, a simple method for removing them is to pass the exhaust stream through a volume of water. However, as the water becomes saturated with a waste gas, the efficiency with which the gas is absorbed decreases, allowing more and more of the waste to pass through the water over time. Saturation of a volume of water with dissolved waste gases can occur relatively rapidly, so that the water must be replaced frequently. A considerable amount of maintenance is therefore required, and the overall efficiency of such a process for waste gas removal is low.

Prior art methods for improving the removal of ammonia gas from an exhaust stream have involved the addition of inorganic acids, such as hydrochloric acid or nitric acid, to the water. This greatly increases the quantity of alkaline gases that can be absorbed, since the dissolved gas will react with the acids to produce inert salts. In order to provide high solubility of alkaline gases, high concentrations of acid are needed.

However, concentrated inorganic acids are hazardous to personnel, as well as being highly corrosive to system components and other equipment. In addition, hazardous by-products which require costly and difficult disposal, are produced. Furthermore, there is an inherent disadvantage in using mineral acids in that the quantity of these acids that can be added to the water is limited. As a result, relatively frequent replacement of the mineral acid/water mixture is required, leading to overall inefficiency of the scrubbing process.

However, solid acids, both inorganic and organic, including various carboxylic acids, have been used for the removal of gases from air. For example, U.S. Pat. No. 1,586,327 to Perrott, et al. discloses the purification of air to render the air suitable for breathing by providing a filter material composed of a granular mixture of an inert filler and an acid. Such a filter material may be packed into a canister of a gas mask for removing ammonia from air to be inhaled.

U.S. Pat. No. 5,626,820 to Kinkead, et al. discloses a chemical air filter for use in the air handling system of a clean room. The filter includes a pleated web of non-woven fibrous material, and having activated carbon particles distributed throughout the web. In one example of the '820, the use of citric acid in combination with a charcoal filter is disclosed.

SUMMARY OF THE INVENTION

The present invention provides a method for removing water soluble, hazardous waste gases from an exhaust stream by passage through a scrubber mixture, wherein the method requires minimal maintenance and poses little hazard to personnel. The scrubber mixture of the invention is preferably prepared from water and a non-toxic, organic acid. The exhaust stream is passed through the scrubber mixture to remove water-soluble and/or alkaline gases (e.g., ammonia). The use of a solid acid improves the capacity and efficiency of the scrubber, greatly increasing the quantity of gas that can be dissolved in a given volume of scrubber mixture, as compared with water or an aqueous solution alone. The increased capacity of the scrubber mixture also reduces the amount of maintenance required for the scrubber. An exemplary acid for use in practice of the invention is citric acid, which has the advantages of being non-toxic, relatively non-irritating to the skin, and does not significantly attack laboratory equipment. Therefore, scrubbing operations are significantly less hazardous as compared to the prior art which uses inorganic mineral acids. In addition, citric acid is inexpensive, providing a low-cost scrubber system. Furthermore, the by-product of the reaction of citric acid with ammonia, ammonium citrate, is benign, as is the case for the by-products of reactions of citric acid with many other waste gases.

According to one aspect of the invention, the use of a solid acid as a component of the scrubber mixture provides for increased capacity of a given volume of scrubber mixture. A solid acid may be added to the scrubber in (large) quantities, greatly exceeding the amount that is soluble in a given volume of water of the scrubber mixture. Undissolved acid, present in a scrubber vessel as a solid deposit, acts as a convenient source of acid for replenishment of the liquid component of the scrubber mixture. Thus, as alkaline waste gas passes through the scrubber mixture and reacts with the dissolved acid, some of the solid portion of the acid dissolves, thereby maintaining the concentration of dissolved acid. According to the invention, the lifetime of the scrubber mixture is limited only by the total amount of solid acid present in the scrubber. The system of the invention thus represents an improvement over the prior art use of inorganic acids, in which the lifetime of the scrubber is limited, more severely, by the quantity of acid that is soluble in the water.

In another aspect of the invention, a method is provided for indicating that the mixture in a scrubber must be replaced. A pH indicator such as phenolphthalein may be added to the acid/water mixture described above. When the scrubber is operational, the mixture is acidic, and the solution of phenolphthalein is colorless. However, if the acid becomes depleted, the liquid component of the scrubber mixture turns a vivid purple-red color. The inclusion of a pH indicator in the scrubber mixture provides a simple, inexpensive, and safe method for determining the status of the scrubber.

In another aspect of the invention, a method is provided for using a single scrubber for removing unequal quantities of acidic and alkaline water-soluble gases from a single exhaust stream. In certain processes, both acidic and alkaline gases will enter the exhaust; for example, during HVPE deposition of gallium nitride, hydrochloric acid and ammonia gases are used during different stages of the process. Overall, a much greater quantity of ammonia than hydrochloric acid enters the exhaust stream. By constantly passing the exhaust stream through the acid/water scrubber mixture as described above, both gases can be efficiently removed in a single process. When ammonia is present in the exhaust, it will react with the acid in solution making the solution less acidic. When the hydrochloric acid is present in the exhaust, it will dissolve efficiently in the water, thereby increasing the acidity of the liquid component of the scrubber mixture. One advantage of this system is that the two processes change the pH of the solution in opposite directions; thus, the capacity of the scrubber is increased. In this case, the lifetime of the scrubber solution will be determined, in part, by an imbalance of the volume of the two gases (HCl and ammonia). If the alkaline gas is in excess (as is the case for HVPE of gallium nitride) the lifetime of the scrubber will be greatly increased by the presence in the scrubber mixture of a solid acid such as citric acid.

In an additional aspect of the present invention a base-scrubber system for removing acid gas from a reactor exhaust stream is used in conjunction with the organic-acid scrubber. The base-scrubber is connected in parallel with the organic acid scrubber or in series with the reaction chamber and the organic-acid scrubber. The preferred base-scrubber contains water and alkaline salt such as $CaCO_3$, $CaOH$, $MgCO_3$, $MgOH$, $NaCO_3$, $NaHCO_3$, $KCO_3$ and $KHCO_3$.

In view of the above, it is an object of the present invention to provide a scrubber assembly for the efficient removal of waste gas(es) from a gaseous medium.

One feature of the invention is that it provides a scrubber assembly including at least one scrubber unit. Another feature of the invention is that it provides a scrubber assembly including at least one indicator tank coupled to the at least one scrubber unit. Another feature of the invention is that it provides a scrubber mixture including an aqueous solution of an acid and a solid acid. Another feature of the invention is that it provides a method of removing waste gases by passing a gas stream through a scrubber mixture having a liquid phase and a solid phase.

One advantage of the invention is that it provides a method for operating a scrubber assembly in which at least one component of a scrubber mixture may be added or removed during operation of the scrubber assembly. Another advantage of the invention is that it provides a scrubber assembly including a pH monitoring unit for safeguarding against inadvertent emission of noxious gases. Another advantage of the invention is that it provides a method of removing waste gases by passing a gas stream through a scrubber mixture which is benign to both personnel and equipment. Another advantage of the invention is that it provides a scrubber assembly adapted for the automatic addition or removal of at least one scrubber mixture component to/from the scrubber mixture during operation of the scrubber assembly.

These and other objects, advantages and features are accomplished by the provision of a scrubber assembly for removing noxious gases from an exhaust gas stream, including: at least one scrubber unit including a scrubber vessel, a scrubber inlet, and a scrubber outlet; wherein the scrubber vessel contains a scrubber mixture having a liquid component and a solid component, the liquid component including an aqueous solution of an organic acid, wherein the solid component is an organic acid.

These and other objects, advantages and features are accomplished by the provision of a gas generation and removal system, including: a scrubber assembly including at least one scrubber unit having a scrubber vessel, a scrubber inlet, and a scrubber outlet; and a scrubber mixture contained within the at least one scrubber vessel, the scrubber mixture composed of water and an organic acid.

These and other objects, advantages and features are accomplished by the provision of a method of operating a scrubber assembly, including: a) providing a scrubber assembly, the scrubber assembly including at least one scrubber unit having a scrubber vessel containing a scrubber mixture, the scrubber vessel having a scrubber inlet; and b) coupling the scrubber inlet to a gas stream; c) passing the gas stream through the scrubber mixture to provide a scrubbed gas stream, wherein the scrubber mixture includes water and an organic acid; and d) monitoring the pH of the scrubber mixture.

These and other objects, advantages and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

DETAILED DESCRIPTION OF THE PREFERRED EMBODIMENTS

Figure 1:
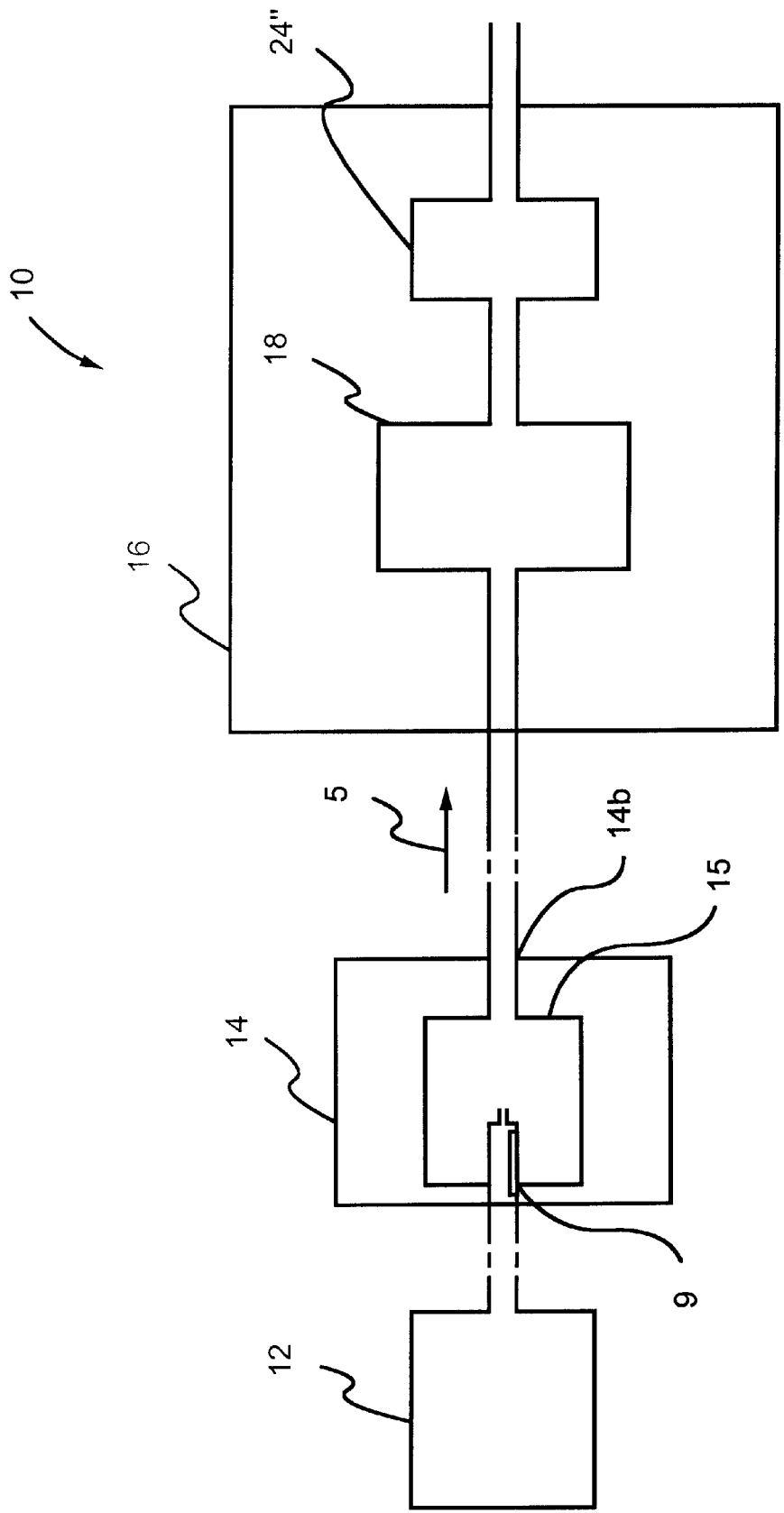
FIG. 1 schematically represents a gas stream generation and removal system, according to the invention.

Referring now to the drawings, FIG. 1 schematically represents a gas stream generation and removal system 10, including a scrubber assembly 16 of the invention. System 10 includes at least one gas source unit 12 connected to a reactor 14 to allow the passage of gas from source unit 12 into reactor 14. Reactor 14 is adapted for performing at least one chemical reaction. As an example, reactor 14 may include a growth chamber 15 and a Ga source 9 for generating vapor-phases of Ga and herein the reactor is adapted for performing GaN deposition on a substrate by hydride vapor-phase deposition. During operation of such a HVPE reactor, the bulk of ammonia and HCl reactants pass, unreacted, through reactor 14. In any event, an exhaust gas stream 5 (represented by the arrow) emanates from reactor outlet 14b. Exhaust gas stream 5 typically includes a number of components including reaction by-products and unreacted gases from source unit 12. Exhaust gas stream 5 passes towards scrubber assembly 16. Scrubber assembly 16 is in communication with reactor 14 via outlet 14b. Scrubber assembly 16 includes at least one scrubber unit 18. Exhaust gas stream 5 is passed through the at least one scrubber unit 18, as will be described fully hereinbelow. Scrubber assembly 16 may also include at least one indicator tank 24" (FIG. 4) for indicating the operational status of system 10, and in particular the status of scrubber unit 18.

Figure 2A:
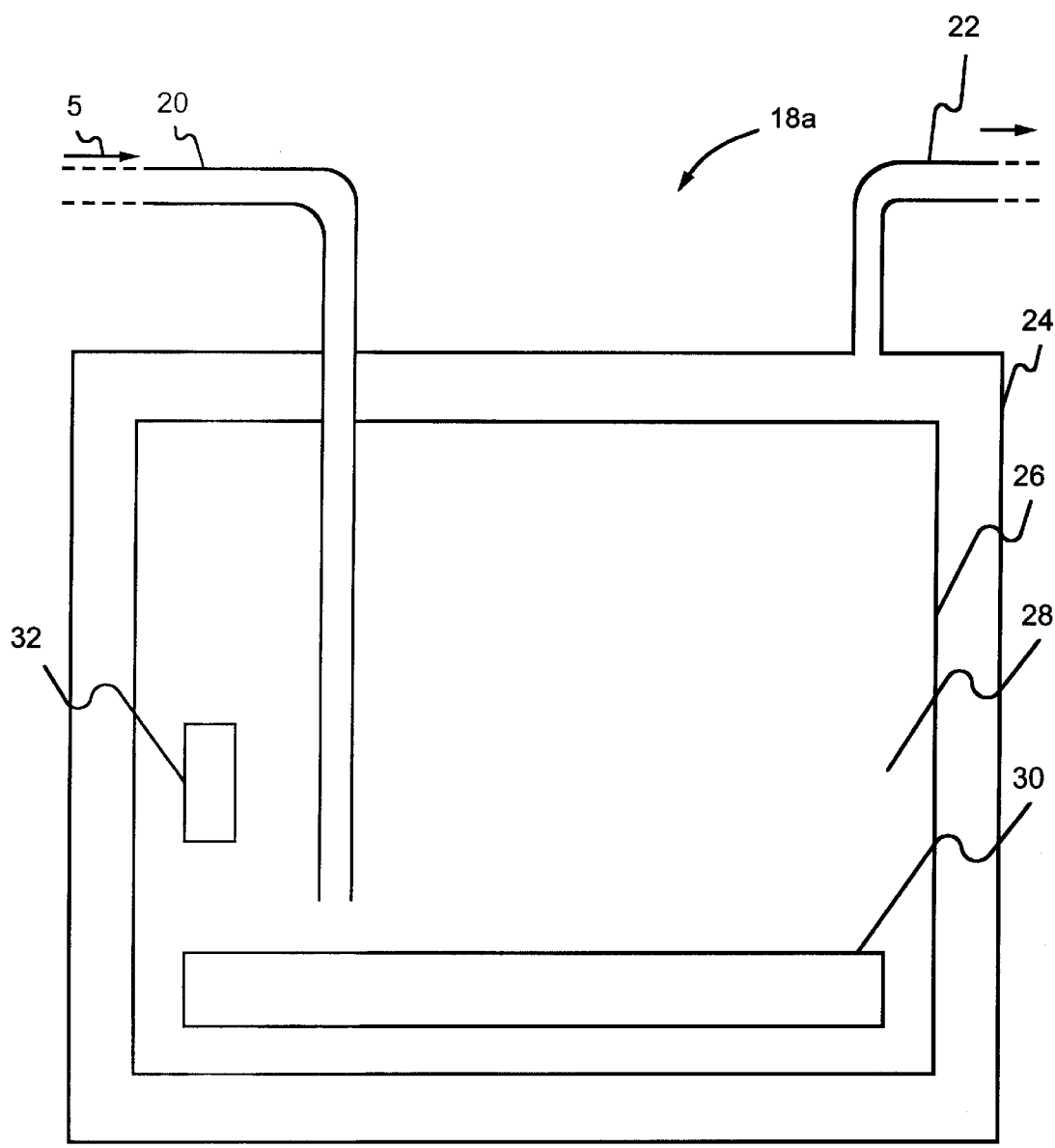
FIG. 2A schematically represents a scrubber assembly, according to one embodiment of the invention.

FIG. 2A schematically represents a scrubber unit 18a, according to one embodiment of the invention. Scrubber unit 18a includes a scrubber inlet 20, a scrubber outlet 22, and a scrubber vessel 24. Scrubber vessel 24 includes a scrubber mixture unit 26. A gas stream (arrow), e.g., from reactor 14, is introduced within mixture unit 26 via scrubber inlet 20. Gas from gas stream 5 passes through mixture unit 26 such that water soluble and/or alkaline gases are retained within mixture unit 26. Retention of water soluble and/or alkaline gaseous components of gas stream 5 may be due to reaction with, and/or dissolution in, components of mixture unit 26.

Scrubber mixture unit 26 preferably includes both a mixture liquid unit 28 and a mixture solid unit 30. According to the invention, mixture solid unit 30 includes a solid organic acid, and mixture liquid unit 28 typically includes an aqueous solution of an acid component of mixture solid unit 30. Preferably, mixture liquid unit 28 includes a saturated or almost saturated solution of an acid of mixture solid unit 30. Scrubber mixture 26 contains at least 1% by volume of water. Scrubber unit 18a may also include a pH monitoring unit 32. Monitoring unit 32 may be in contact with liquid unit 28. For example, monitoring unit 32 may comprise a pH meter of various types, well known in the art, in which an electrode is in contact with liquid unit 28. Alternatively, and according to a currently preferred embodiment of the invention, monitoring unit 32 may be dispersed in liquid unit 28 in the form of a pH indicator which changes color in a predictable manner in response to defined changes in pH value of liquid unit 28. An exemplary pH indicator is phenolphthalein. A preferred concentration of a pH indicator such as phenolphthalein is in the range of about 10–100 ppm.

Mixture liquid unit 28 includes water and an organic acid dissolved in the water. Mixture liquid unit 28 may also include a pH indicator, such as phenolphthalein. Mixture solid unit 30 includes an organic acid. Preferably, an organic acid of mixture solid unit 30 includes a naturally occurring carboxylic acid. Naturally occurring carboxylic acids tend to be benign or harmless to both personnel and to system components and equipment. Examples of organic acids include citric acid, tartaric acid, oxalic acid, and acetic acid. A currently preferred organic acid of mixture solid unit 30 is citric acid. However, other carboxylic acids, which are solid at the operating temperature of scrubber unit 18', may also be used. Numerous other naturally occurring carboxylic acids are well known in the art Liquid unit 28 comprises a liquid component of mixture 26, while solid unit 30 comprises a solid component of mixture 26. The liquid component of the scrubber mixture preferably comprises from about 5% to about 99.9% by volume of the scrubber mixture; more preferably from about 10% to about 99% by volume of the scrubber mixture; and most preferably from about 50% to about 95% by volume of the scrubber mixture. Preferably, the solid component represents from about 0.1% to about 95% by volume of the scrubber mixture.

Mixture solid unit 30 may be introduced in vessel 24 and allowed to settle out as a deposit below the bulk of mixture unit 26. Alternatively, solid unit 30 may be retained on or within a cage (not shown) or other structure, either prior to or after introduction into vessel 24. The cage or other structure allows the free access of liquid unit 28 to solid unit 30.

The use of a solid acid as a component of mixture unit 26 greatly increases its capacity for removing an alkaline gas, as compared with a liquid acid. Solid acid, e.g., citric acid, may be added to scrubber vessel 24 in excess amount, far exceeding the quantity that is soluble in the volume of water of liquid unit 28. As alkaline waste gas passes through liquid unit 28 and reacts with the acid in solution, an amount of acid of solid unit 30 dissolves in the water of liquid unit 28 to replace that consumed by reaction with the alkaline gas. In this way, a saturated solution of the acid can be maintained over time as more and more exhaust gas stream is passed through liquid unit 28. The lifetime of a scrubber unit (e.g., 18a) operated in batch mode, i.e. non-continuously, is limited only by the total amount of citric acid present in mixture unit 26. In contrast, prior art systems and processes are more severely limited, namely by the amount of acid that is soluble in the water of a scrubber mixture.

Figure 2B:
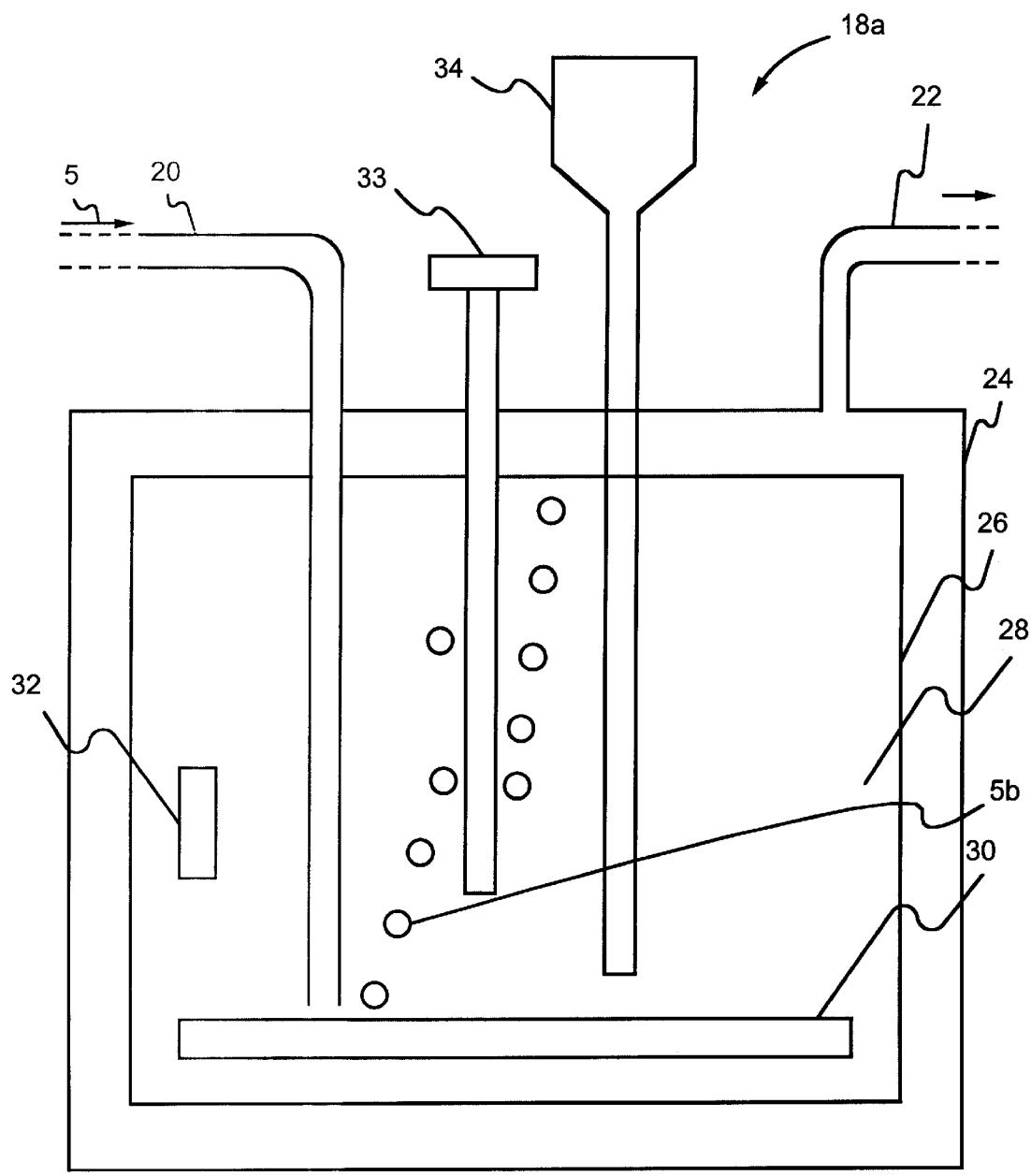
FIG. 2B schematically represents a scrubber assembly, according to another embodiment of the invention.

FIG. 2B schematically represents a scrubber unit 18b, according to another embodiment of the invention. Scrubber unit 18b may include the same, or substantially the same, components as scrubber unit 18a (FIG. 2A). Scrubber unit 18b may further include an agitation or mixing unit 33 for stirring of mixture unit 26 in general, and liquid unit 28 in particular. As an example, mixing unit 33 may be in the form of an impeller, an impeller magnetically coupled to the impeller such as a magnetic stir bar and stirring hot plate, or similar device, well known in the art, and may serve to maintain a substantially uniform distribution of solutes within liquid unit 28. Mixing of liquid unit 28 may also promote retention of gas bubbles 5b within liquid unit 28.

Scrubber unit 18b may further include a mixture feed unit 34. Components of mixture unit 26 may be fed from feed unit 34 to vessel 24 to maintain a particular volume, amount or concentration of such components in mixture unit 26. According to one embodiment, feed unit 34 is adapted for introducing additional amounts of solid unit 30 to mixture unit 26 during operation of scrubber unit 18b. The addition of solid acid to mixture unit 26 during operation of scrubber unit 18b can substantially increase the length of time for which scrubber unit 18a can be operated.

Figure 3:
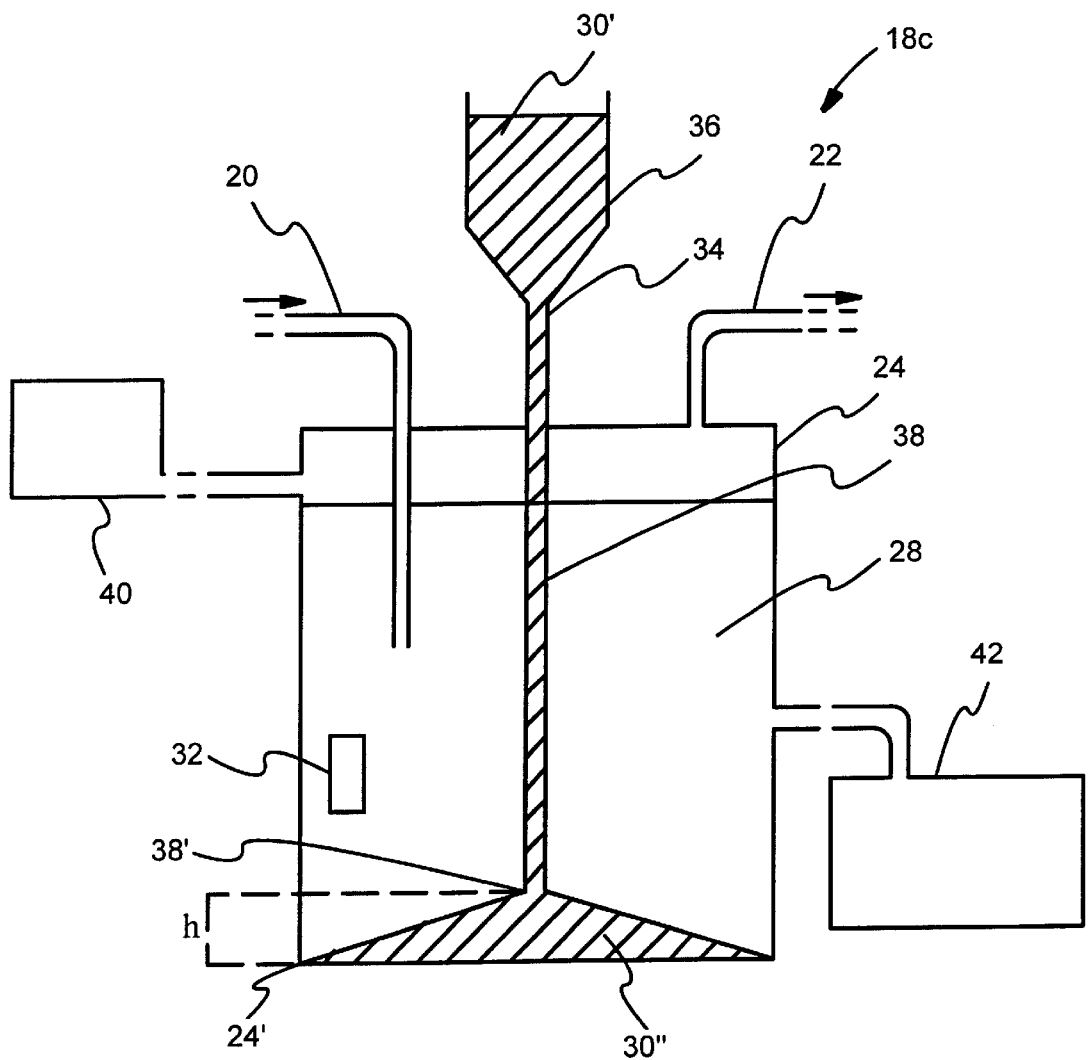
FIG. 3 schematically represents a scrubber assembly, according to yet another embodiment of the invention.

FIG. 3 schematically represents a scrubber unit 18c, according to another embodiment of the invention. Scrubber unit 18c may include the same, or substantially the same, components as scrubber unit 18a (FIG. 2A) Scrubber unit 18c may further include a mixture feed unit 34, specifically adapted for replenishing a supply of solid acid located within vessel 24 in the form of deposit 30". Mixture feed unit 34 includes a feed reservoir 36 and a feed spout 38 having a feed spout distal end 38'. Feed reservoir 36 contains reservoir acid 30'. Feed spout 38 may be arranged such that distal end 38' terminates at a defined height, h above base 24' of scrubber vessel 24. Feed reservoir 36 is in communication with a deposit of solid acid 30" via feed spout 38. According to one embodiment, feed spout 38 may be raised or lowered to vary the value of h.

According to on- embodiment of the invention, distal end 38' of spout 38 is at least partially occluded by solid acid deposit 30", the latter deposited on base 24' of vessel 24 in the vicinity of spout distal end 38'. As deposit 30" begins to dissolve to replenish acid removed from solution by reaction with alkaline gas, spout distal end 38' is freed from deposits 30", thereby allowing additional quantities of reservoir acid 30' to be delivered from feed reservoir 36 to base 24' of scrubber vessel 24. In this way a supply of solid citric acid or other acid may be automatically maintained within scrubber vessel 24. In this way the lifetime of scrubber unit 18c may be greatly extended, and maintenance is decreased.

According to another embodiment of the invention, acid may be added to the scrubber vessel from an acid reservoir (not shown) by various other methods. Such additions can be arranged or programmed to correspond to pH readings of the scrubber mixture monitored by monitoring unit 32 during operation of scrubber unit 18c.

Furthermore, unit 18c may include a liquid inlet unit 40, in communication with vessel 24, for the addition of components of liquid unit 28. For example, water may be added to vessel 24 via unit 40. Similarly, unit 18c may include a liquid outlet unit 42 for the systematic removal or withdrawal of components of liquid unit 28. Unit 18c may be operated in a continuous (i.e. non-batch) process for removal of toxic waste gases from an exhaust gas stream, with minimal downtime and maintenance.

Figure 4:
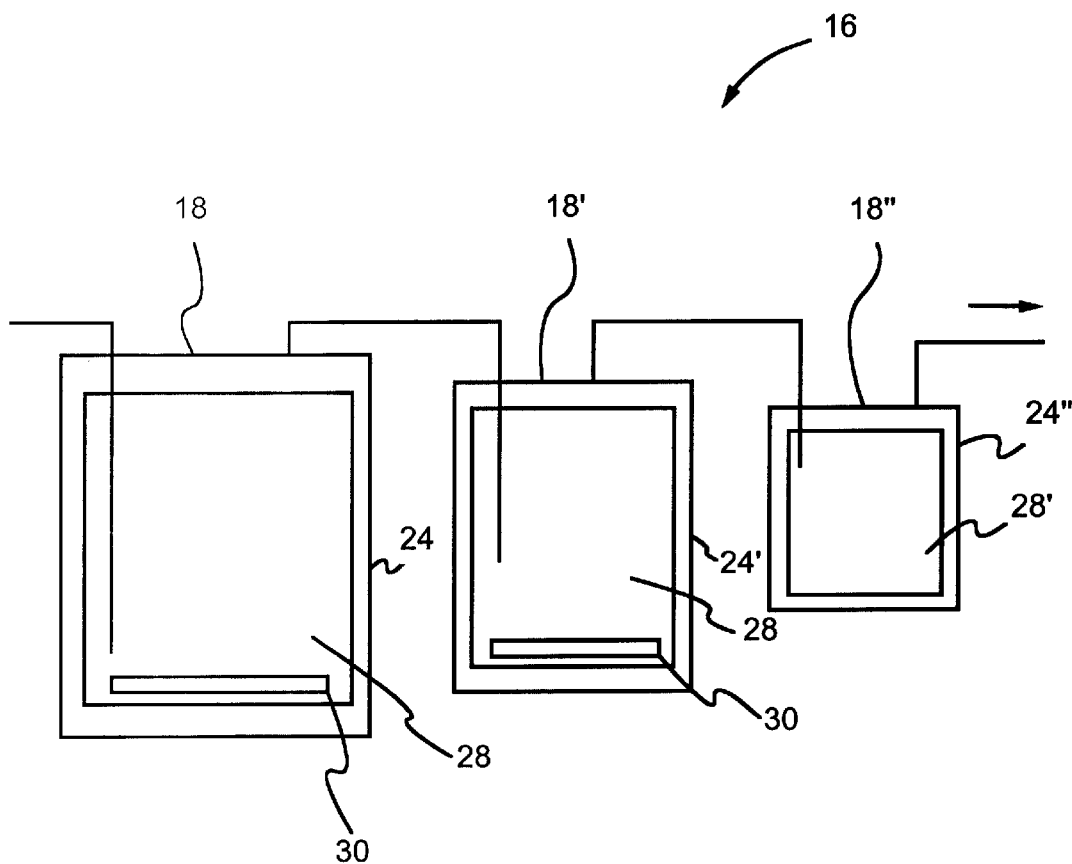
FIG. 4 schematically represents a scrubber assembly including a plurality of scrubber vessels, according to another embodiment of the invention.

FIG. 4 schematically represents scrubber assembly 16, wherein a plurality of scrubber units 18, 18', are connected to each other in series, according to another embodiment of the invention. According to alternative embodiments of the invention, a terminal (downstream) unit (e.g., 18") may be either a scrubber unit, i.e. analogous to units 18, 18' and containing scrubber mixture unit 26; or unit 18" may serve as an indicator unit wherein vessel 24" serves as an indicator tank. In the latter case, indicator tank 24" contains an indicator mixture (e.g., water and a pH indicator) instead of scrubber mixture 26.

According to a currently preferred embodiment, assembly 16 has a total of two scrubber units 18, 18', and an indicator tank unit 18", in which the volume of vessels 24, 24', 24" successively diminishes in he downstream direction (arrows). A gas stream may be passed to and between vessels 24, 24', 24" by means of suitable conduits or tubing; e.g., acid-resistant plastic tubing may be used.

It is to be understood that other numbers and arrangements of scrubber units, e.g., 18, are contemplated and are within the scope of the invention. Furthermore, each of scrubber units 18, 18' (18") may represent any of the embodiments of a scrubber unit described hereinabove with reference to FIGS. 2A, 2B, and 3, such as scrubber units 18a, 18b, or 18c.

The size of vessels 24, 24', 24" may be determined according to the particular intended application for assembly 16. Also, the size of scrubber units 18, 18' and of their respective scrubber vessels 24, 24' may be, at least to some extent, a matter of design choice. However, according to a currently preferred embodiment, vessels 24, 24', 24" preferably have a volume in the range of about 10–40, 5–20, and 0.5–5 liters, respectively. The volume of mixture (scrubber mixture 26 in vessels 24, 24'; scrubber mixture 26 or indicator mixture 28' in vessel 24") is preferably in the range of about 5–99% that of the total volume of each vessel (24, 24', 24"); more preferably in the range of about 30–95% that of the total volume of each vessel; and most preferably in the range of about 60–90% that of the total volume of each vessel. A particular example of a scrubber assembly 16, having a plurality of scrubber units (e.g., 18, 18') and an indicator tank 24", is described fully in Example 1, hereinbelow.

Figure 5:
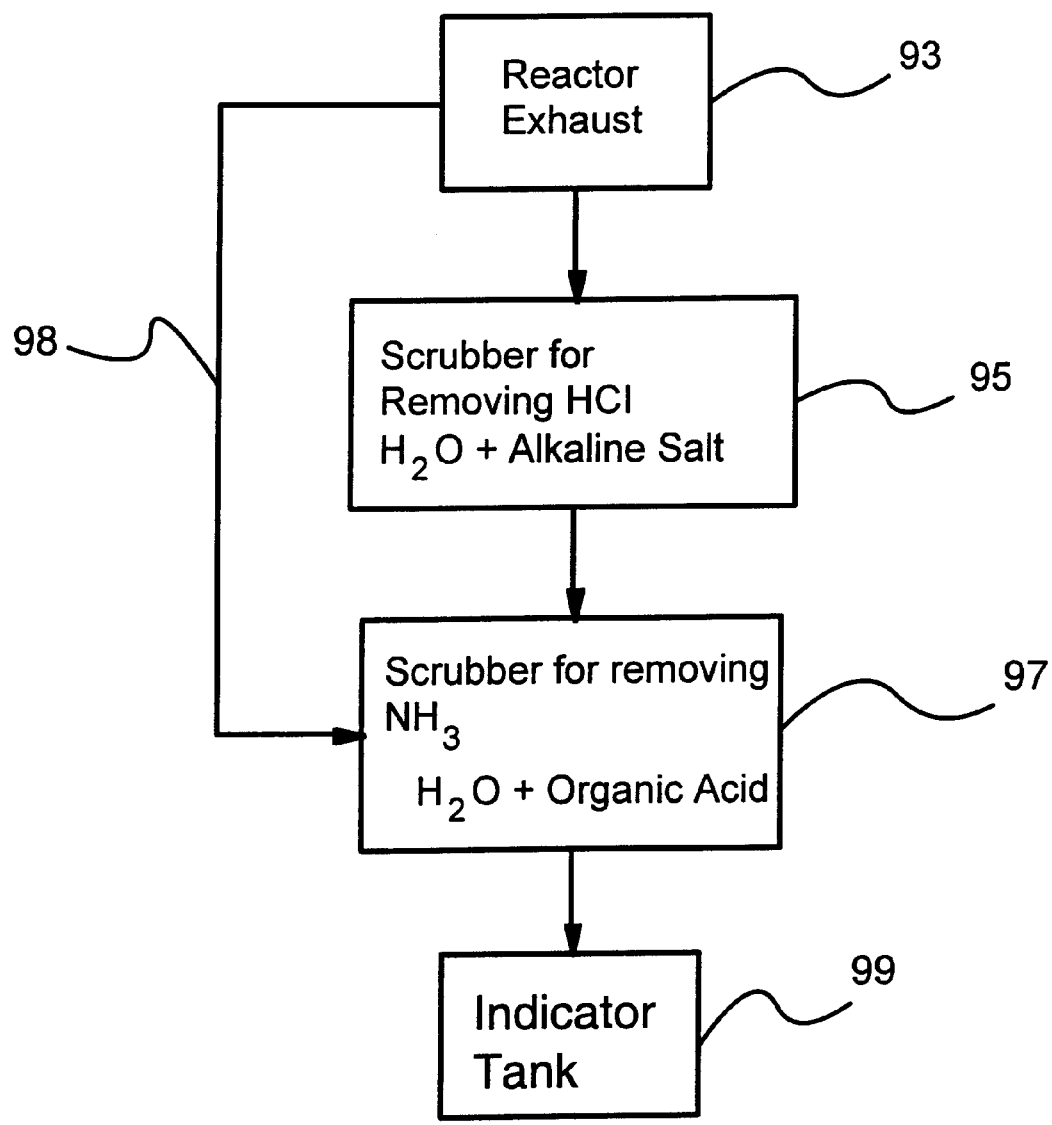
FIG. 5 schematically represents a series of steps involved in a method of removing at least one component from a gas stream, according to another embodiment of the invention.

FIG. 5 illustrates a simplified schematic of a reaction system that employs the organic-acid scrubber 97 described above in with a base-scrubber 95 for removing acid from a reactor exhaust stream 93 connected in series between the organic-acid scrubber 97 and a reactor. Base-scrubber may also be connected in parallel with Lhe organic acid-scrubber illustrated by arrow 98 and several base scrubbers can be connected together in series (not shown). The preferred base-scrubber contains water and alkaline salt such as $CaCO_3$, $CaOH$, $MgCO_3$, $MgOH$, $NaCO_3$, $NaHCO_3$, $KCO_3$ and $KHCO_3$. The base-scrubber preferably has all the operational features and embodiments described above for organic acid scrubber including a chemical delivery system chemical concentration testing system or indicator and a mixing system.

Figure 6:
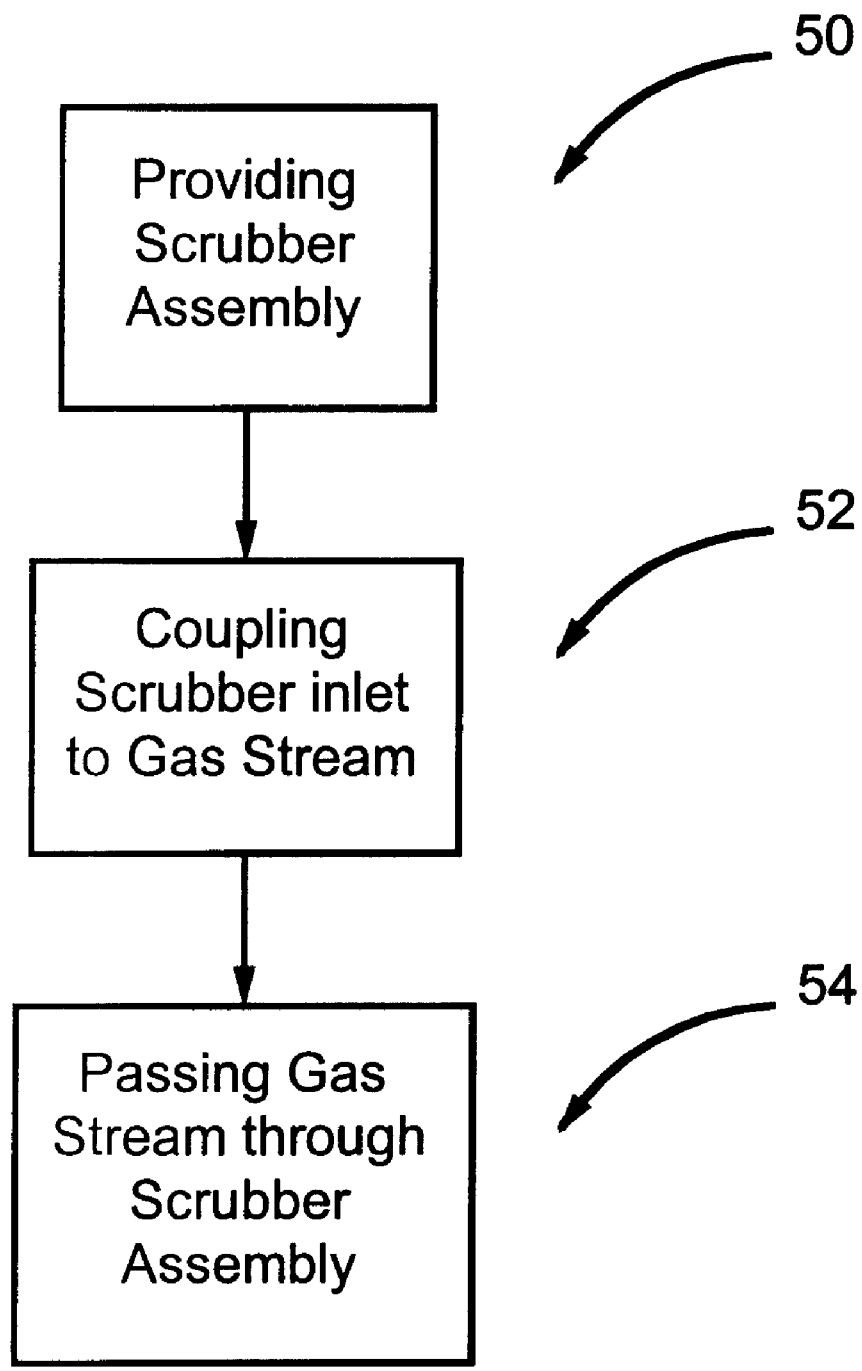
FIG. 6 schematically represents a series of steps involved in a method of removing at least one component from a gas stream, according to another embodiment of the invention.
Figure 7:
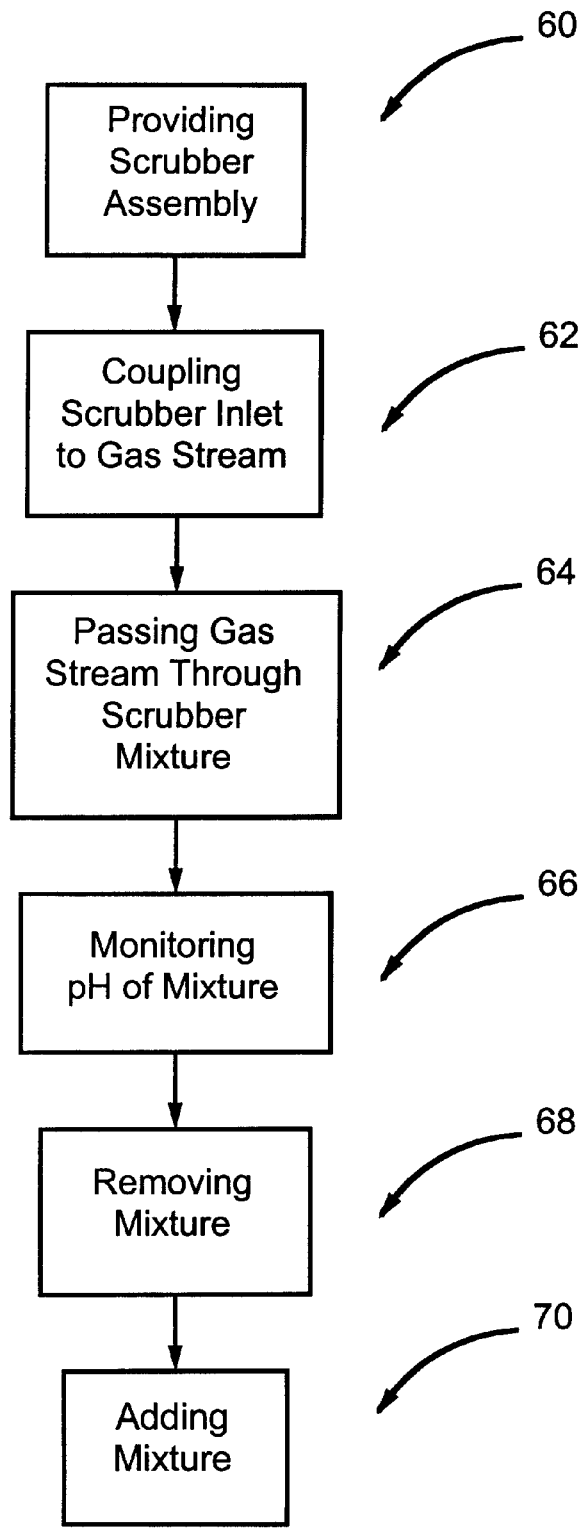
FIG. 7 schematically represents a series of steps involved in a method of operating a scrubber assembly, according to another embodiment of the invention.

FIG. 6 schematically represents a series of steps involved in a method of removing at least one component from a gas stream, according to another embodiment of the invention, in which step 50 involves providing a scrubber assembly. The scrubber assembly provided in step 50 includes at least one scrubber unit, such as those described with reference to FIGS. 2A, 2B, and 3. The scrubber unit contains a scrubber mixture of the type described hereinabove. Preferably the scrubber mixture includes a liquid phase and a solid phase. The scrubber unit includes a scrubber vessel and a scrubber inlet unit. The scrubber assembly may further include at least one indicator tank in communication with the at least one scrubber unit.

Step 52 involves coupling the scrubber vessel, via the scrubber inlet unit, to a source of a gas stream. For example, the scrubber inlet unit may be coupled to an outlet of a reactor (e.g., reactor 14, FIG. 1). Step 54 involves passing the gas of the gas stream through the scrubber mixture of the at least one scrubber unit. In particular, the gas is passed through the liquid phase of the scrubber mixture.

Preferably the liquid phase of the scrubber mixture is an aqueous solution of an organic acid, and the solid phase of the scrubber mixture is the same organic acid in solid form. Most preferably, the liquid phase is an aqueous solution of citric acid, and the solid phase is a solid deposit of citric acid. Other carboxylic acids which may be used as components of the scrubber mixture are preferably solids at the operating temperature of the scrubber assembly.

After passage of the gas stream through the at least one scrubber unit, noxious gases may be largely or completely removed from the gas stream, and the resulting scrubbed gas stream may be vented or passed into an indicator mixture contained in at least one indicator tank. According to one embodiment, the indicator mixture is an aqueous solution of a color change indicator, such as phenolphthalein.

FIG. 6 schematically represents a series of steps involved in a method of operating a scrubber assembly, according to another embodiment of the invention. Steps 60, 62 and 64 of FIG. 6 are analogous to steps 50, 52, and 54 described hereinabove with reference to FIG. 5. Step 66 may involve monitoring the pH of the scrubber mixture (e.g., unit 26, FIG. 2A). Alternatively, or in addition to monitoring the pH of the scrubber mixture, and according to a currently preferred embodiment, step 66 may involve monitoring the pH of the scrubber mixture in an indicator tank (unit 24", FIG. 4).

pH monitoring of the scrubber mixture may be performed continuously or periodically; either by means of a pH meter, or by means of a pH indicator (both well known in the art). In the latter case, the pH indicator, e.g., phenolphthalein may be dispersed within the scrubber mixture or the indicator mixture, as a component thereof. During normal operation of the scrubber unit, the pH of the liquid phase of the scrubber mixture will remain below pH 8.3. Using phenolphthalein as a pH indicator, the liquid phase of the scrubber mixture will remain colorless while the pH is below 8.3. However, when the supply of solid acid (e.g., solid unit 30, FIG. 2A) is depleted, e.g., due to reaction with ammonia, the scrubber mixture is unable to absorb or dissolve additional ammonia without increase in pH of the scrubber mixture. Under these circumstances the pH of the scrubber mixture will rise. Any increase in pH above 8.3 causes the phenolphthalein to turn from colorless to a vivid purple color. This color change thereby signals the need for maintenance of the scrubber unit, e.g., the need for further quantities of acid to be added to the scrubber mixture. Monitoring of the pH of the scrubber mixture greatly enhances the efficiency of operation of the scrubber assembly. Monitoring the pH of the indicator mixture acts as a further safeguard against inadvertently emitting hazardous waste gases from the scrubber assembly.

In a further step, step 68, at least a portion of the scrubber mixture may be removed from the scrubber vessel, e.g., via liquid outlet unit 42 (FIG. 3). In step 70, any single component or all of the components of the scrubber mixture may be added to the scrubber vessel. For example, water, an aqueous acid solution, a pH indicator, or a solid organic acid may be added. Such components may be added to the scrubber vessel, for example, via the liquid inlet unit (unit 40, FIG. 3) or via the feed unit (unit 34, FIG. 3).

Such additions of various components to the scrubber mixture may be performed in response to depletion of the solid phase (e.g., deposit 30", FIG. 3) or in response to monitored changes in pH of the scrubber mixture. Appropriate additions of scrubber mixture components to the scrubber vessel serves to greatly increase the overall operating efficiency of the scrubber assembly.

EXAMPLE 1

Noxious gas(es) (e.g., ammonia and/or hydrochloric acid gas), which may be in an exhaust gas stream from a reactor, exit the reactor through an exhaust system. The exhaust gas stream is directed sequentially through two vessels, e.g., 24, 24', connected in series. Each vessel contains a scrubber mixture of water, citric acid, and phenolphthalein. The first vessel (e.g. 24, FIG. 4) may have a volume of about 5 gallons, and contains 16 liters of water, 25 pounds of citric acid, and 0.1 grams of phenolphthalein. The second tank (24', FIG. 4) may have a volume of about 2.5 gallon, and contains 8 liters of water, 5 pounds of citric acid, and 0.1 grams of phenolphthalein.

The gases bubble (upwards) through the liquid of the scrubber mixture in each vessel (24, 24')and exit via a scrubber gas outlet (unit 22, e.g., FIGS. 2A, 2B). As the gas stream passes through the scrubber mixture, the ammonia or hydrochloric acid is dissolved in the water. Due to the high solubility of these two gases in water, virtually no ammonia nor HCl remains in the exhaust stream as it leaves the scrubber vessels. After passing through the first and second scrubber vessels, the exhaust stream passes through an indicator tank or vessel. The indicator vessel does not contain a scrubber mixture. Instead, the indicator vessel contains indicator mixture, e.g., 500 milliliters of water and 0.1 grams of phenolphthalein. In this case, the indicator mixture is a sensitive indicator of pH changes in the contents of the indicator vessel. In turn, undesirable pH changes in the contents of the indicator vessel signal the need for maintenance of the scrubber assembly.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A method of removing water soluble gas from a gas stream, comprising the steps of:
   a) providing a scrubber assembly, the scrubber assembly including at least one scrubber unit, the scrubber unit having a scrubber vessel containing a scrubber mixture, the scrubber vessel having a scrubber inlet, and an indicator tank; and
   b) coupling the scrubber inlet to a source of an exhaust gas; and
   c) passing the exhaust gas through the scrubber mixture to provide a scrubbed gas stream, wherein the scrubber mixture includes water and an organic acid.

2. The method of claim 1, further comprising the step of: after said step c), passing the scrubbed gas stream into an indicator tank.

3. The method of claim 2, wherein the indicator tank contains an indicator mixture, the indicator mixture comprises water and a pH indicator.

4. The method of claim 3, wherein the indicator mixture comprises water and 10 mg to 1 g of phenolphthalein per liter of the water.

5. The method of claim 1, wherein the organic acid is a solid at an ambient operating temperature of the scrubber unit.

6. The method of claim 1, wherein the organic acid is selected from the group consisting of acetic acid, tartaric acid, and citric acid.

7. The method of claim 1, wherein the scrubber mixture comprises water, dissolved citric acid, solid citric acid, and a pH indicator.

8. The method of claim 1, wherein the scrubber mixture consists essentially of water, citric acid, and a pH indicator, wherein a portion of the citric acid is solid.

9. The method of claim 1, wherein the scrubber mixture comprises water, 0.1 to 5.0 Kg of citric acid per liter of the water, and 1 to 50 mg of phenolphthalein per liter of the water.

10. The method claim 1, wherein the said source of exhaust gas is a reactor Wherein said reactor is adapted for vapor-phase deposition of nitrides, and said gas stream comprises ammonia.

11. The method of claim 10, wherein said reactor comprises a Ga source for generating vapor-phases of Ga, said reactor is adapted hydride vapor-phase deposition of GaN films, and said gas stream comprises ammonia and HCl.

12. A gas generation and removal system, comprising: a scrubber assembly including at least one scrubber unit, said scrubber unit having a scrubber vessel, a scrubber inlet, and a scrubber outlet; a scrubber mixture contained within said scrubber vessel, said scrubber mixture comprising water and an organic acid; and an indicator tank connected in series to said scrubber vessel.

13. The system of claim 12, wherein said organic acid is a carboxylic acid.

14. The system of claim 12, wherein said scrubber mixture contains at least 1% by volume of water.

15. The system of claim 12, wherein said organic acid is a solid at an ambient operating temperature of said at least one scrubber unit.

16. The system of claim 12, wherein said organic acid is selected from the group consisting of acetic acid, tartaric acid, and citric acid.

17. The system of claim 12, wherein said scrubber mixture comprises water, dissolved citric acid, and solid citric acid.

18. The system of claim 12, wherein said scrubber mixture further comprises a pH indicator.

19. The system of claim 18, wherein said pH indicator comprises phenolphthalein.

20. The system of claim 12, wherein said scrubber mixture consists essentially of water and citric acid, wherein a portion of said citric acid is solid.

21. The system of claim 12, wherein said scrubber mixture consists essentially of water, citric acid, and a pH indicator, wherein a portion of said citric acid is solid.

22. The system of claim 12, further comprising a pH monitoring unit, said pH monitoring unit in communication with said scrubber mixture, said pH monitoring unit for monitoring the pH of said scrubber mixture.

23. The system of claim 12, wherein said scrubber assembly comprises a plurality of scrubber vessels, wherein said plurality of scrubber vessels are connected in series.

24. The system of claim 12, further comprising a reactor, said reactor including a reactor outlet, said reactor outlet adapted for the passage of a gas stream from said reactor, said reactor outlet coupled to said scrubber inlet.

25. The system of claim 24, wherein said reactor is adapted for vapor-phase deposition of metal nitrides and the gas stream comprises ammonia.

26. The system of claim 25, wherein said reactor comprises a Ga source for generating vapor-phases of Ga, said reactor is adapted for hydride vapor-phase deposition of GaN films, and said gas stream comprises ammonia and HCl.

27. The system of claim 24, further comprising a base-scrubber comprising water and an alkaline salt for removing acid-gas from the gas stream of the reactor and wherein the base scrubber has an inlet and an outlet and the reactor outlet coupled to the scrubber inlet.

28. The system of claim 27, wherein the base-scrubber for removing acid gas is connected in series with the scrubber assembly for removing ammonia gas between the scrubber assembly and the reactor.

29. The system of claim 27, wherein the base-scrubber is configured for removing HCl from the gas stream and the alkaline salt is selected from the group consisting of $CaCO_3$, CaOH, $MgCO_3$, MgOH, $NaCO_3$, $NaHCO_3$, $KCO_3$ and $KHCO_3$.

30. The system of claim 12, further comprising a mixture feed unit in communication with said scrubber vessel.

31. The system of claim 12, wherein said mixture feed unit is adapted for automatically feeding a solid component of said scrubber mixture into said scrubber vessel.

32. A method of operating a scrubber assembly, comprising the steps of:
a) providing a scrubber assembly, the scrubber assembly including at least one scrubber unit, the scrubber unit having a scrubber vessel containing a scrubber mixture, the scrubber vessel having a scrubber inlet, and at least one indicator tank, the indicator tank containing a indicator mixture;
b) coupling the scrubber inlet to a source of exhaust gas;
c) passing the exhaust gas through the scrubber mixture to provide a scrubbed gas stream, wherein the scrubber mixture includes water and an organic acid; and
d) monitoring the pH of the scrubber mixture.

33. The method of claim 32, further comprising the step of monitoring the pH of the indicator mixture.

34. The method of claim 33, wherein the indicator mixture comprises water and a pH indicator.

35. The method of claim 32, further comprising the step of: e) removing at least an aliquot of the scrubber mixture during operation of the scrubber assembly.

36. The method of claim 32, further comprising the step of:
f) adding at least one component of the scrubber mixture during operation of the scrubber assembly.

37. The method of claim 32, wherein the organic acid is a solid at an ambient operating temperature of the at least one scrubber unit.

38. The method of claim 32, wherein the organic acid is selected from the group consisting of acetic acid, tartaric acid, and citric acid.

39. The method of claim 32, wherein the scrubber mixture comprises water, dissolved citric acid, solid citric acid, and a pH indicator.

40. A scrubber assembly for removing noxious gases from an exhaust gas, comprising:
at lease is scrubber unit, said at least one scrubber unit including a scrubber vessel, a scrubber inlet, and a scrubber outlet; wherein said scrubber vessel contains a scrubber mixture, said scrubber mixture comprising a liquid component and a solid component, said liquid component comprises an aqueous solution of an organic acid, and said solid component comprising an organic acid.

41. The scrubber assembly of claim 40, wherein said liquid component comprises from about 5% to about 99.9% by volume of said scrubber mixture.

42. The scrubber assembly of claim 40, wherein said liquid component comprises from about 10% to about 99% by volume of said scrubber mixture.

43. The scrubber assembly of claim 40, wherein said liquid component comprises from about 50% to about 95.9% by volume of said scrubber mixture.

44. The scrubber assembly of claim 40, wherein said liquid component comprises from about 0.1% to about 95% by volume of said scrubber mixture.

45. The scrubber assembly of claim 40, further comprising at least one indicator tank, said at least one indicator tank connected in series to one of said at least one scrubber units, said at least one indicator tank containing an indicator mixture.

46. The scrubber assembly of claim 45, further comprising at least one pH monitoring unit for monitoring the pH of said scrubber mixture or pH of said indicator mixture.

47. The scrubber assembly of claim 40 wherein said solid component consists essentially of pure carboxylic acid.

48. The scrubber assembly of claim 40, wherein said scrubber mixture further comprises a pH indicator.

49. The scrubber assembly of claim 40, wherein said at least one scrubber unit includes a cage, said cage adapted for containing said solid component.

50. The scrubber assembly of claim 40, further comprising at least one mixture feed unit, said at least one mixture feed unit adapted for automatically adding at least one component of said scrubber mixture to said scrubber vessel.

* * * * *